United States Patent
Kim et al.

(10) Patent No.: US 6,982,341 B1
(45) Date of Patent: Jan. 3, 2006

(54) VOLATILE COPPER AMINOALKOXIDE COMPLEX AND DEPOSITION OF COPPER THIN FILM USING SAME

(75) Inventors: Yunsoo Kim, Daejeon (KR); Chang Gyoun Kim, Daejeon (KR); Taek-Mo Chung, Daejeon (KR); Sun Sook Lee, Daejeon (KR); Ki-Seok An, Daejeon (KR); Taek Seung Yang, Daejeon (KR); Hong Suk Jang, Daejeon (KR)

(73) Assignee: Korea Research Institute of Chemical Technology, (KR)

( * ) Notice: Subject to any disclaimer, the term of this patent is extended or adjusted under 35 U.S.C. 154(b) by 1 day.

(21) Appl. No.: 11/093,995

(22) Filed: Mar. 30, 2005

(51) Int. Cl.
*C07F 1/08* (2006.01)
*C23C 16/18* (2006.01)

(52) U.S. Cl. .................. 556/113; 427/250; 427/255.11; 427/593; 438/681

(58) Field of Classification Search .......... 556/113; 427/250, 255.11, 593; 438/681
See application file for complete search history.

(56) References Cited

U.S. PATENT DOCUMENTS 6,369,256 B1 * 4/2002 Chi et al. .............. 556/113
6,822,107 B1 11/2004 Baum et al. ............ 556/113

OTHER PUBLICATIONS

Ralf Becker, et al., *A Study on the Metal-Organic CVD of Pure Copper Films From Low Cost Copper (II) Dialkylamino-2-propoxides: Tuning of the Thermal Properties of the Precursor by Small Variations of the Lignad.*, Chemical Vapor Deposition, 2003, 9, No. 3, p. 149-156.

* cited by examiner

*Primary Examiner*—Porfirio Nazario-Gonzalez
(74) *Attorney, Agent, or Firm*—Anderson Kill & Olick, PC (57) ABSTRACT

A volatile copper aminoalkoxide complex of formula (I) can form a copper thin film having an improved quality by metal organic chemical vapor deposition (MOCVD):

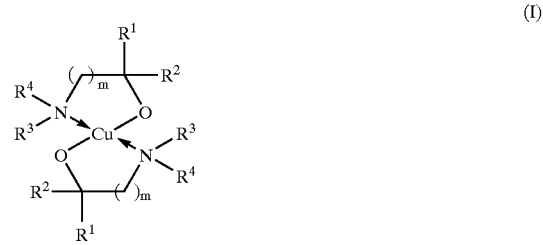

(I)

wherein, $R^1$, $R^2$, $R^3$ and $R^4$ are each independently $C_{1-4}$ alkyl optionally carrying one or more fluorine substituents; and m is an integer in the range of 1 to 3.

6 Claims, 11 Drawing Sheets

VOLATILE COPPER AMINOALKOXIDE COMPLEX AND DEPOSITION OF COPPER THIN FILM USING SAME

FIELD OF THE INVENTION

The present invention relates to a volatile copper aminoalkoxide complex; a process of the preparation thereof; and a metal organic chemical vapor deposition (MOCVD) process for forming a copper thin film on a substrate using said compound.

BACKGROUND OF THE INVENTION

Copper thin films are used as interconnects in semiconductor devices owing to the fact that copper has a very low resistivity of 1.67 $\mu\Omega$·cm, a high resistance to electromigration and a high melting point. There have been reported studies of preparing such copper films by metal organic chemical vapor deposition (MOCVD) using cuprous organocopper compounds such as (hfac)Cu(vtms) (hfac=1,1,1,5,5,5-hexafluoro-2,4-pentanedionato, vtms=vinyltrimethylsilane) and cupric organocopper compounds such as $Cu(hfac)_2$. In addition, Caulton et al. of Indiana University synthesized such a cupric organocopper precursor containing two β-ketoimine ligands with nitrogen donor moieties which are capable of forming dative bonds with copper [D. V. Baxter, K. G. Caulton, W.-C. Chiang, M. H. Chisholm, V. F. DiStasi, S. G. Dutremez, K. Folting, *Polyhedron*, 2001, 20, 2589].

However, it has been discovered that (hfac)Cu(vtms) has poor thermal stability, $Cu(hfac)_2$ requires too high a decomposition temperature, and the copper β-ketoimine compound by Caulton et al. has relatively low volatility. Further, these conventional precursors are known to give copper thin films containing carbon or fluorine contaminants [V. M. Donnelly, M. E. Gross, *J. Vac. Sci. Technol. A*, 1993, 11, 66; and T. Gerfin, M. Becht, K. Dahmen, *Mater Sci. Eng. B*, 1993, 17, 97].

Besides the above-mentioned copper β-diketonate and β-ketoimine compounds, Davis et al. of Virginia Polytech. reported on the deposition of a copper thin film by way of effecting intramolecular β-hydrogen extraction of $Cu(OCH_2CH_2NMe_2)_2$, and recently, Chi et al., by intramolecular amine/imine conversion of $Cu(OCCF_3R^1CH_2NHR^2)_2$ [V. L. Young, D. F. Cox, M. E. Davis, *Chem. Mater.*, 1993, 5, 1701; and P.-F. Hsu, Y. Chi, T.-W. Lin, C.-S. Liu, A. J. Carty, S.-M. Peng, *Chem. Vap. Deposition*, 2001, 7, 28].

However, the conventional copper aminoalkoxide compounds have the problem that the purity of the formed copper thin film is unsatisfactorily low. Also, most of the reported compounds are solids at room temperature.

SUMMARY OF THE INVENTION

Accordingly, it is an object of the present invention to provide a novel organocopper compound which has high volatility and high thermal stability, and can be advantageously used in forming a copper thin film of improved quality under a mild condition.

It is another object of the present invention to provide a process for preparing said compound.

It is a further object of the present invention to provide a process for depositing a copper thin film on a substrate using said compound.

In accordance with one aspect of the present invention, there is provided a copper aminoalkoxide complex of formula (I):

(I)

wherein, $R^1$, $R^2$, $R^3$ and $R^4$ are each independently $C_{1-4}$ alkyl optionally carrying one or more fluorine substituents; and m is an integer in the range of 1 to 3.

In accordance with another aspect of the present invention, there is provided a process for preparing said copper aminoalkoxide complex of formula (I) comprising reacting a compound of formula (II) with a compound of formula (III) or reacting a compound of formula (IV) with a compound of formula (V), in an organic solvent:

$Cu(OMe)_2$ (II)

$HOCR^1R^2(CH_2)_mNR^3R^4$ (III)

$CuX_2$ (IV)

$MOCR^1R^2(CH_2)_mNR^3R^4$ (V)

wherein, X is halogen; M is Li or Na; and $R^1$, $R^2$, $R^3$, $R^4$ and m are the same as previously defined.

In accordance with further another aspect of the present invention, there is provided a process for depositing a copper thin film on a substrate which comprises bringing the vapor of the copper aminoalkoxide complex of formula (I) into contact with a substrate heated to a temperature ranging from 170 to 320° C.

BRIEF DESCRIPTION OF THE DRAWINGS

The above and other objects and features of the present invention will become apparent from the following description of the invention taken in conjunction with the following accompanying drawings, which respectively show.

DETAILED DESCRIPTION OF THE INVENTION

The novel compound of formula (I) of the present invention is a complex formed between two aminoalkoxide ligands and one divalent copper ion, wherein the coordination number of the copper ion is saturated, and the two $C_{1-4}$ alkyl groups at the α-carbon and the two $C_{1-4}$ alkyl groups bonded to the amino-nitrogen atom serve to shield the oxygen and nitrogen atoms of the aminoalkoxide ligand. This minimizes the compounds' intermolecular interactions and confers on the compound a high affinity toward an organic solvent such as diethyl ether, tetrahydrofuran, toluene and a mixture thereof.

The inventive copper complex is either a liquid or solid at room temperature, can be vaporized at a low temperature in the range of 30 to 100° C., and undergoes facile and clean thermal decomposition to provide a contaminant-free copper thin film under a mild condition when applied to an MOCVD process, while generating volatile hydrocarbon species through intramolecular β-hydrogen elimination.

Among the compounds of formula (I) of the present invention, the preferred are those wherein $R^1$, $R^2$, $R^3$ and $R^4$ are each independently $CH_3$, $CF_3$, $C_2H_5$, $CH(CH_3)_2$ or $C(CH_3)_3$, and m is 1 or 2.

The inventive complex of formula (I) may be prepared by reacting a compound of formula (II) with a compound of formula (III) in an organic solvent such as toluene under a reflux condition, as shown in Reaction Scheme A:

Reaction Scheme A wherein, $R^1$, $R^2$, $R^3$, $R^4$ and m have the same meanings as defined above.

Alternatively, the inventive complex of formula (I) may be prepared by reacting a compound of formula (IV) with a compound of formula (V) in an organic solvent such as tetrahydrofuran, hexane and toluene at a temperature ranging from 60 to 110° C., as shown in Reaction Scheme B:

Reaction Scheme B wherein, $R^1$, $R^2$, $R^3$, $R^4$, m, X and M have the same meanings as defined above.

As shown in Reaction Schemes A and B, the compound of formula (III) or (V) is reacted with the compound of formula (II) or (IV) in a stoichiometric ratio, e.g., in an amount of 2 equivalents based on 1 equivalent of the compound of formula (II) or (IV) to prepare the inventive copper complex of formula (I).

In accordance with the present invention, a copper thin film may be deposited on a substrate by bringing the vapor of the copper aminoalkoxide complex of formula (I) into contact with a substrate heated to a temperature ranging from 170 to 320° C.

The formal decomposition mechanism for the conversion of the inventive copper complex into metallic copper in such MOCVD is shown in Reaction Scheme C:

Reaction Scheme C wherein, $R^1$, $R^2$, $R^3$, $R^4$ and m have the same meanings as defined above.

The inventive copper complex converts to metallic copper through intramolecular β-hydrogen elimination on decomposition, while generating volatile hydrocarbon species such as aminoalcohols, ketones and endiamines.

The substrate which may be used in practicing the present invention is any inorganic solid that is stable at or above the film deposition temperature and examples thereof include glass, quartz, silicon, gallium arsenide, sapphire, alkali metal niobate and alkaline earth metal titanate, among which a TiN— or TaN-coated single crystal of silicon is preferred when the coated substrate is intended for use in electronic applications.

The following Examples are given for the purpose of illustration only, and are not intended to limit the scope of the invention.

<Synthesis of Copper Aminoalkoxide Complex of formula (I)>

EXAMPLE 1

Bis(dimethylamino-2-methyl-2-propoxy)copper(II) (Cu(dmamp)$_2$)

1.25 g (9.98 mmol) of Cu(OMe)$_2$ was suspended in 50 mL of toluene in a 125 mL Schlenk flask and 2.35 g (20.05 mmol) of dimethylamino-2-methyl-2-propanol was slowly added thereto. The color of the mixed solution gradually changed to dark purple. The dark purple mixture was refluxed for 18 hours under a nitrogen atmosphere and filtered. The resulting filtrate was distilled in a vacuum to remove the solvent. The solid obtained was purified by sublimation at 40° C. under a reduced pressure of $10^{-2}$ Torr, to give 2.4 g of the title compound in the form of a dark purple solid having a melting point of 80–90° C. (yield: 82%).

Elemental analysis: Calculated for $C_{12}H_{28}N_2O_2Cu$: C, 48.71; H, 9.54; N, 9.47. Found: C, 47.39; H, 9.75; N, 9.17.

Figure 1:
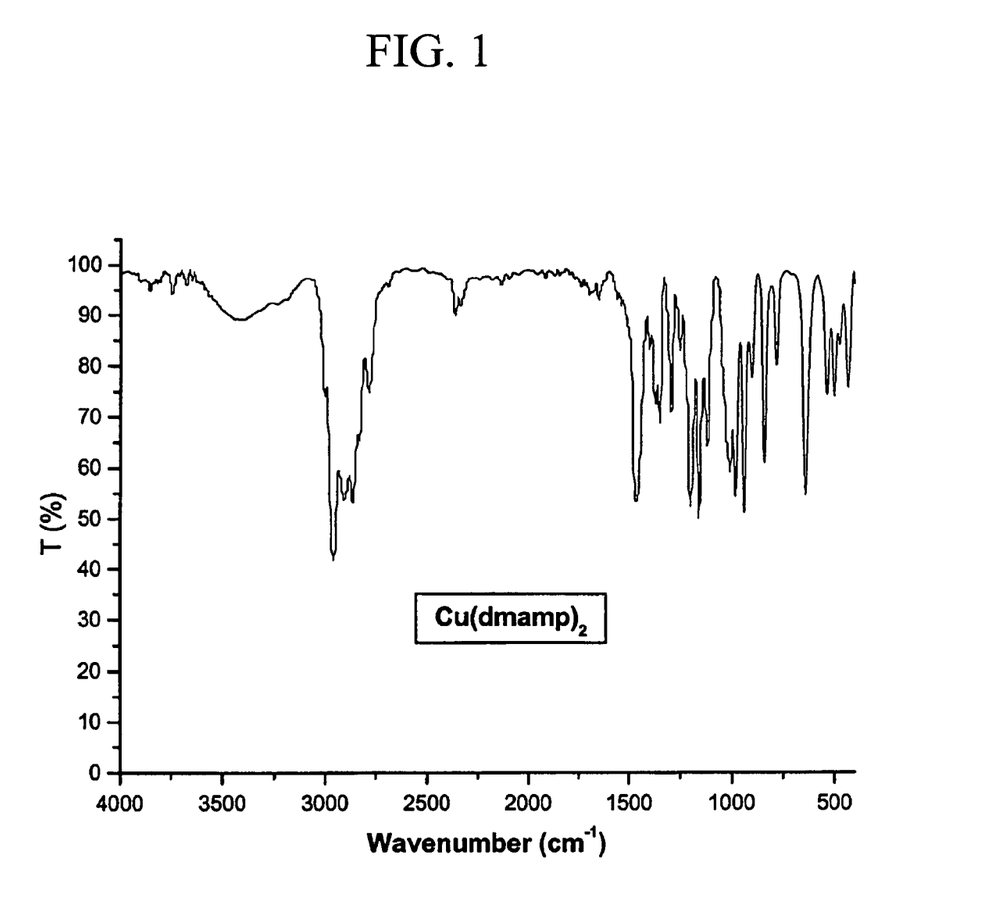
FIGS. 1 to 4: Fourier transform infrared (FTIR) spectra of the copper aminoalkoxide complexes prepared in Examples 1 to 4, respectively.

FTIR (cm$^{-1}$, KBr pellet): ν(M—O) 537, 500, 430 (see FIG. 1).

Mass spectrometry (EI, 70 eV), m/z (ion, relative intensity): 295 ([Cu(L)$_2$]$^+$, 9), 237 ([Cu(L)$_2$—CH$_2$NMe$_2$]$^+$, 37), 222 ([Cu(L)$_2$—CH$_2$NMe$_2$—Me]$^+$, 9), 179 ([Cu(L)]$^+$, 34), 164 ([Cu(L)—Me]$^+$, 17), 58 ([CH$_2$NMe$_2$]$^+$, 100).

EXAMPLE 2

Bis(diethylamino-2-methyl-2-propoxy)copper(II) (Cu(deamp)$_2$)

0.24 g (10.44 mmol) of Na was suspended in 50 mL of toluene in a 125 mL Schlenk flask and 1.46 g (10.05 mmol) of diethylamino-2-methyl-2-propanol was slowly added thereto. The mixture was refluxed for 16 hours under a nitrogen atmosphere and filtered. The resulting filtrate was slowly added to a suspension of 0.68 g (5.06 mmol) of CuCl$_2$ in 25 mL of THF and stirred at room temperature for 4 hours. The resulting solution was filtered and the filtrate was distilled in a vacuum to remove the solvent, to give 1.54 g of the title compound in the form of a dark purple liquid having a high viscosity (yield: 86%).

Elemental analysis: Calculated for $C_{16}H_{36}N_2O_2Cu$: C, 54.59; H, 10.31; N, 7.96. Found: C, 55.33; H, 10.77; N, 9.32.

Figure 2:
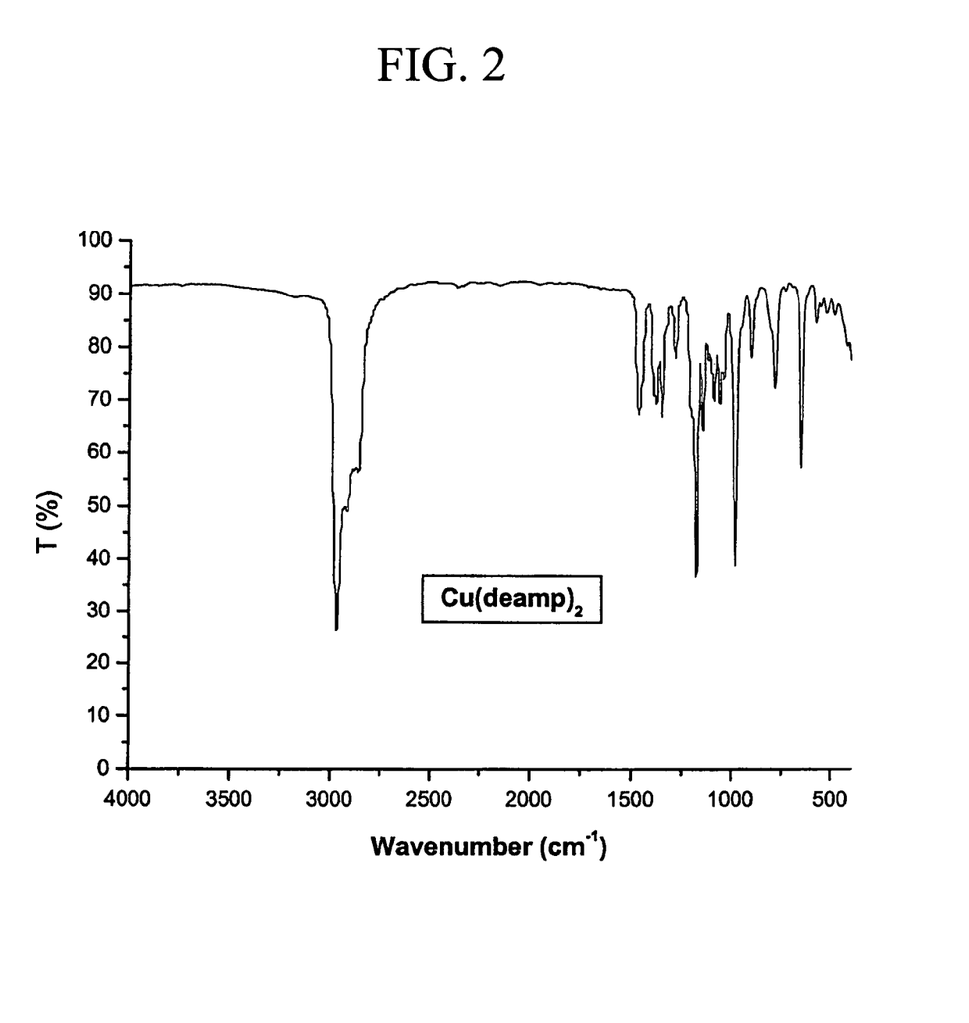

FTIR ($cm^{-1}$, KBr pellet): ν(M—O) 571, 522, 416 (see FIG. 2).

Mass spectrometry (EI, 70 eV), m/z (ion, relative intensity): 352([Cu(L)$_2$]$^+$, 10).

EXAMPLE 3

Bis(dimethylamino-2-methyl-2-butoxy)copper(II) (Cu(dmamb)$_2$)

5.05 g (16.32 nmol) of Cu(OMe)$_2$ was suspended in 50 mL of toluene in a 125 mL Schlenk flask and 4.30 g (32.64 mmol) of dimethylamino-2-methyl-2-butanol was slowly added thereto. The mixture was refluxed for 18 hours under a nitrogen atmosphere and filtered. The resulting filtrate was distilled in a vacuum to remove the solvent. The liquid residue was purified by distillation at 60° C. under a reduced pressure of $10^{-2}$ Torr, to give 4.41 g of the title compound in the form of a dark purple liquid (yield: 83.5%).

Elemental analysis: Calculated for $C_{14}H_{32}N_2O_2Cu$: C, 51.90; H, 9.96; N, 8.65. Found: C, 52.30; H, 10.40; N, 8.96.

Figure 3:
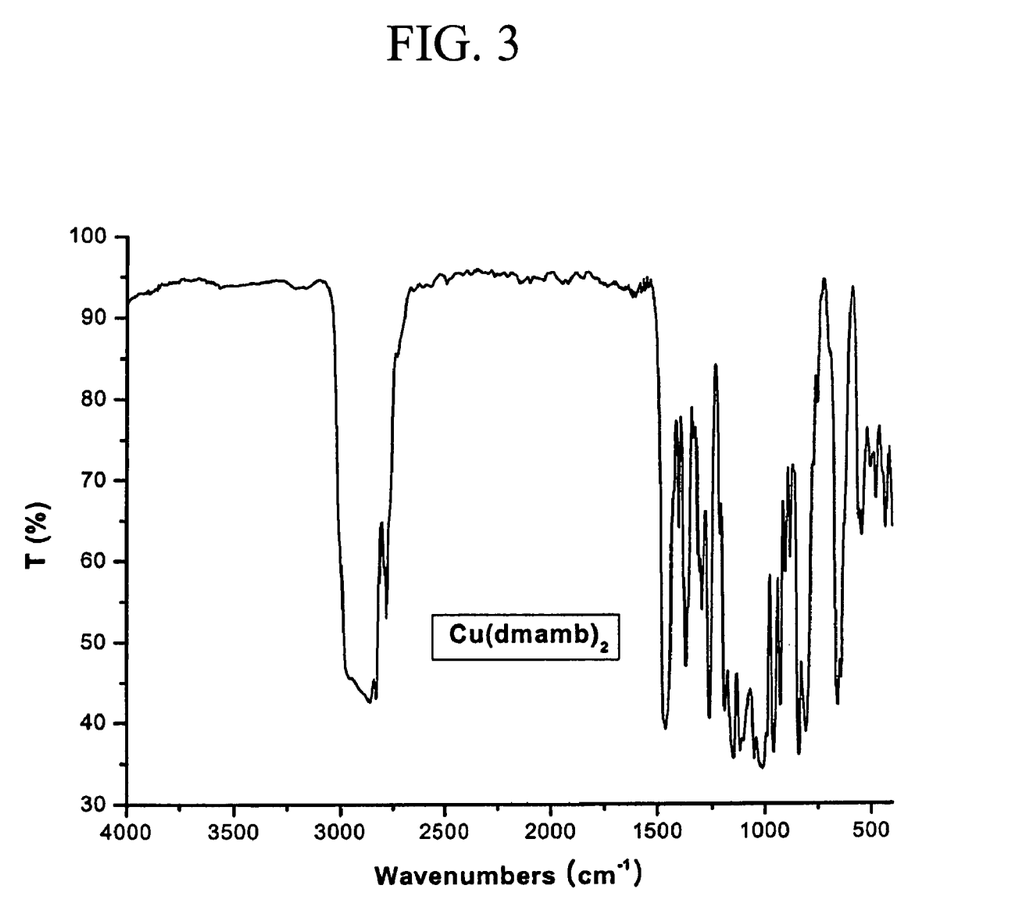

FTIR ($cm^{-1}$, KBr pellet): ν(M—O) 545, 505, 432 (see FIG. 3).

Mass spectrometry (EI, 70 eV), m/z (ion, relative intensity): 323 ([Cu(L)$_2$]$^+$, 17), 193 ([Cu(L)]$^+$, 21).

EXAMPLE 4

Bis(ethylmethylamino-2-methyl-2-butoxy)copper(II) (Cu(emamb)$_2$)

0.70 g (5.57 mmol) of Cu(OMe)$_2$ was suspended in 50 mL of toluene in a 125 mL Schlenk flask and 1.62 g (11.15 mmol) of ethylmethylamino-2-methyl-2-butanol was slowly added thereto. The mixture was refluxed for 18 hours under a nitrogen atmosphere and filtered. The resulting filtrate was distilled in a vacuum to remove the solvent. The liquid residue was purified by distillation at 80° C. under a reduced pressure of $10^{-2}$ Torr, to give 1.81 g of the title compound in the form of a dark purple liquid (yield: 92.5%).

Elemental analysis: Calculated for $C_{16}H_{36}N_2O_2Cu \cdot 2H_2O$: C, 49.52; H, 10.39; N, 7.22. Found: C, 49.88; H, 10.15; N, 7.67.

Figure 4:
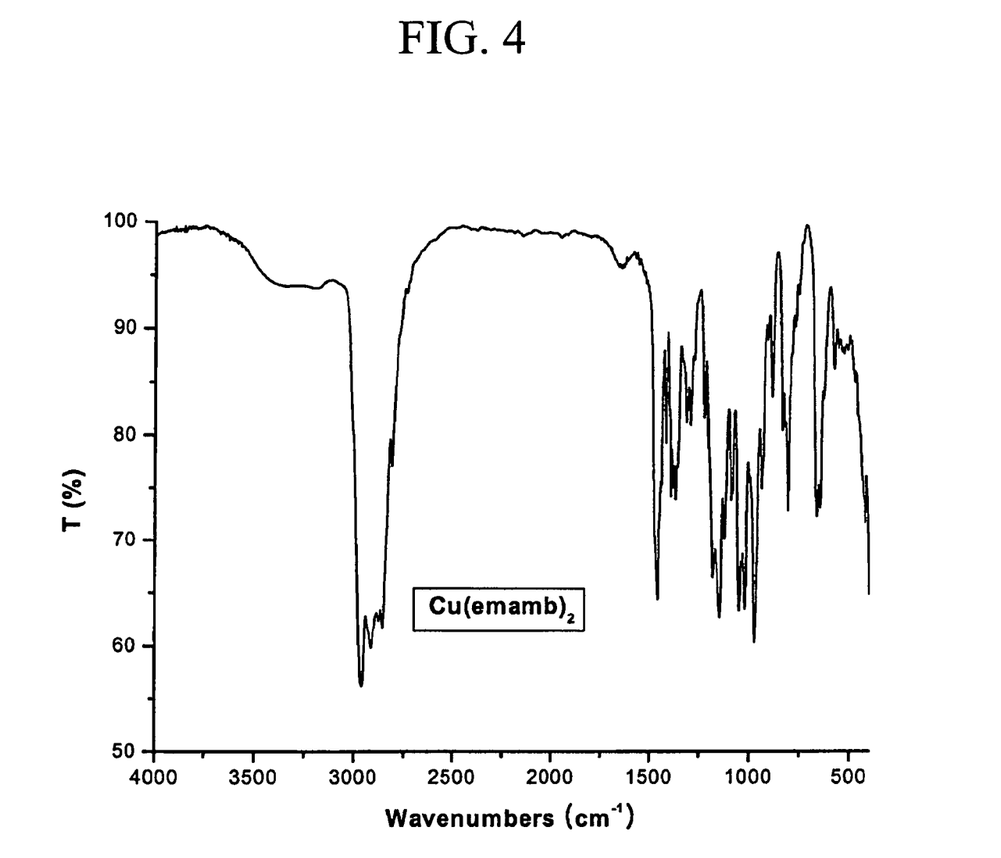
Figure 5:
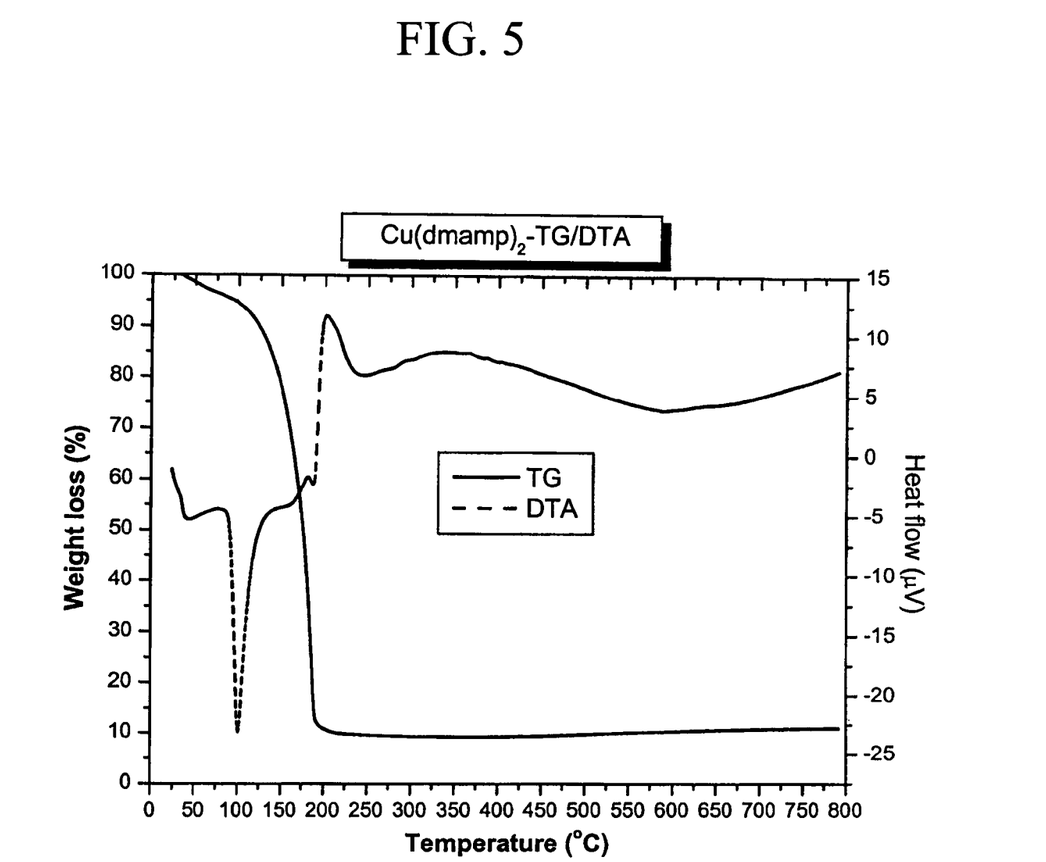
FIGS. 5 to 8: Thermogravimetric analysis (TGA)/differential thermal analysis (DTA) scans of the copper aminoalkoxide complexes prepared in Examples 1 to 4, respectively.
Figure 6:
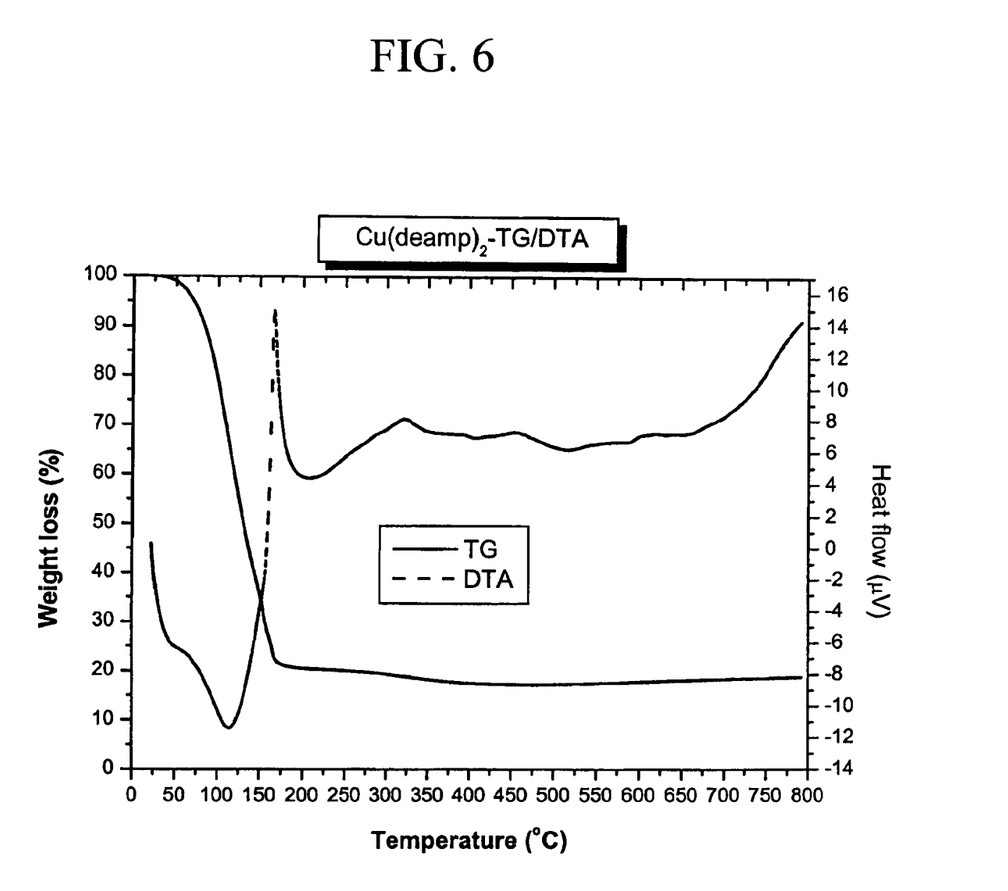
Figure 7:
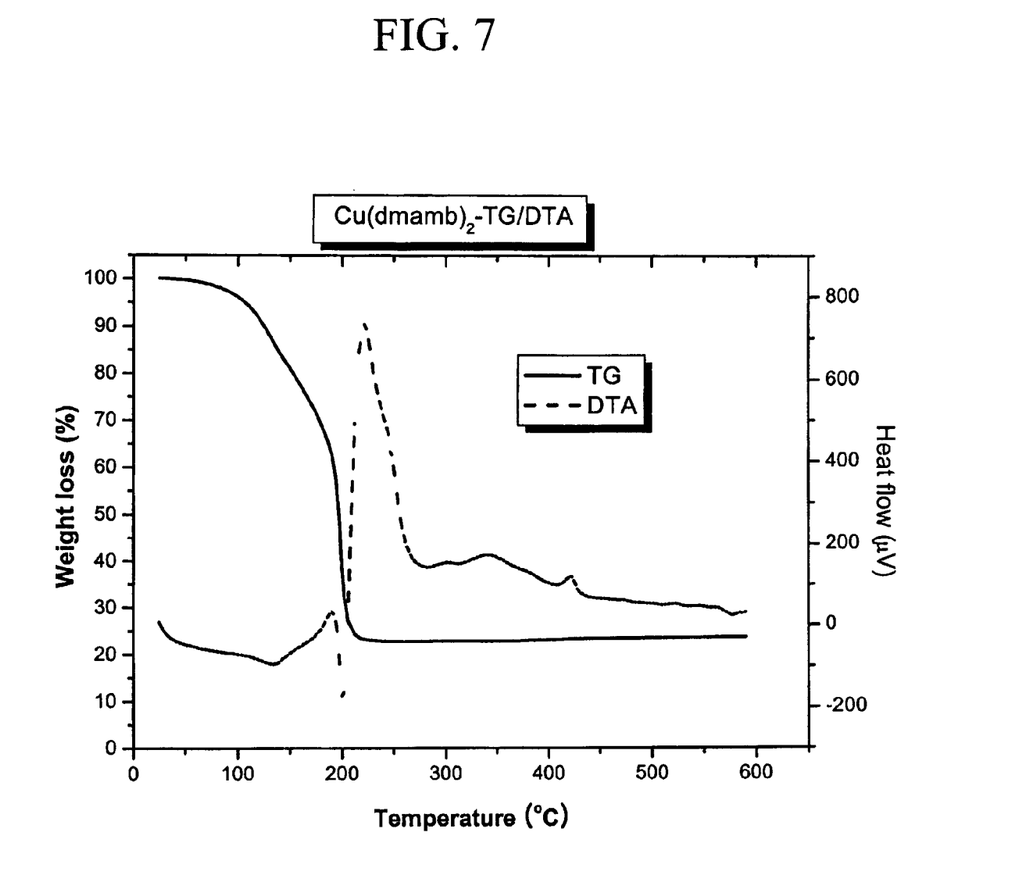
Figure 8:
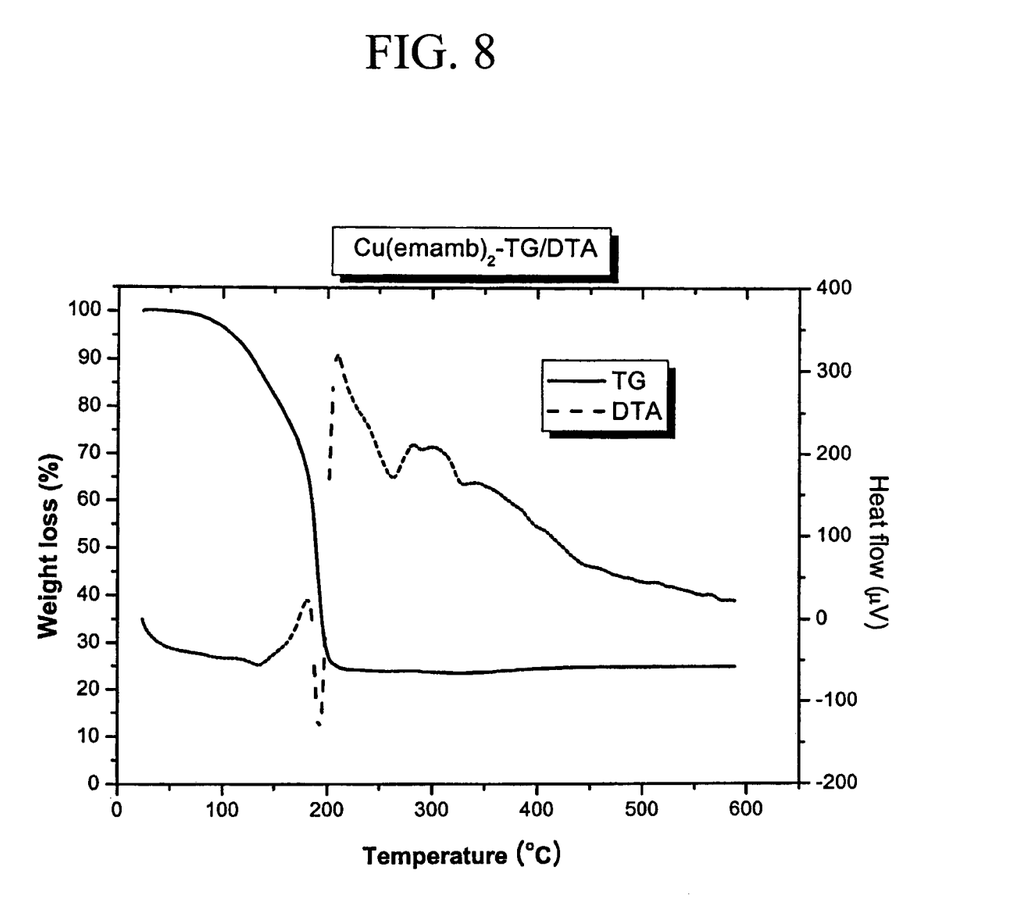

FTIR ($cm^{-1}$, KBr pellet): ν(M—O) 576, 507, 418 (see FIG. 4).

Mass spectrometry (EI, 70 eV), m/z (ion, relative intensity): 351 ([Cu(L)$_2$]$^+$, 6), 207 ([Cu(L)]+, 42).

Thermogravimetric analysis (TGA) and differential thermal analysis (DTA) scans of the copper aminoalkoxide complexes prepared in Examples 1 to 4 are shown in FIGS. 5 to 8, respectively. The TGA results revealed that Cu(dmamp)$_2$, Cu(dmamb)$_2$ and Cu(emamb)$_2$ each underwent an abrupt weight loss in the temperature range 100 to 200° C., and Cu(deamp)$_2$, 60 to 170° C., and also that $T_{1/2}$ (the temperature at which the weight of the sample was reduced to half) of Cu(dmamp)$_2$, Cu(deamp)$_2$, Cu(dmamb)$_2$ and Cu(emamb)$_2$ were 175° C., 130° C., 190° C. and 190° C., respectively. DTA scans showed that they all have endothermic peaks due to decomposition around 200° C.

Figure 9:
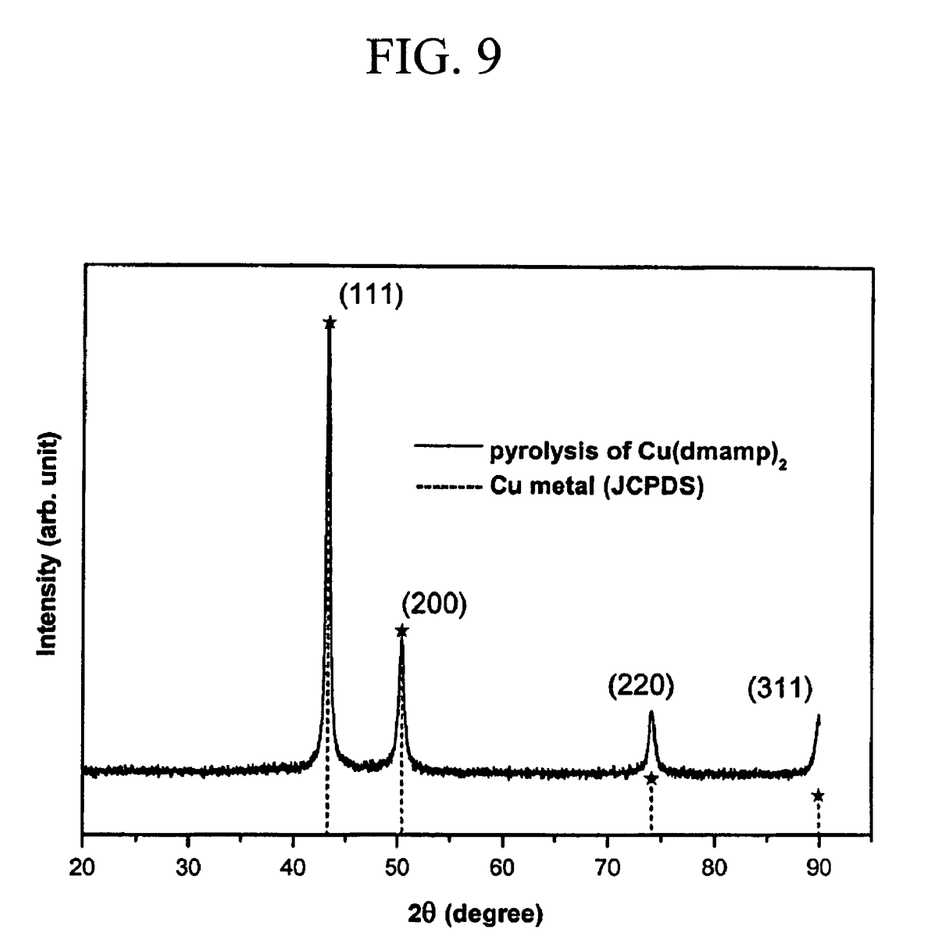
FIG. 9: X-ray diffraction (XRD) pattern of the decomposition product from the copper complex prepared in Example 1.

In addition, Cu(dmamp)$_2$ prepared in Example 1 underwent thermal decomposition when heated at 200° C. for 3 hours under an inert nitrogen atmosphere, and X-ray diffraction (XRD) pattern of the remaining solid shown in FIG. 9 confirms that the solid obtained by the decomposition was pure cubic copper. Further, $^1$nuclear magnetic resonance ($^1$H-NMR) and gas chromatography/mass spectrometry (GC-MS) results of the products recovered after the thermal decomposition showed that $HOC(Me)_2CH_2N(Me)_2$, $Me_2CO$ and $Me_2NC(H)=C(H)NMe_2$ were generated as by-products.

These results suggest that the copper complexes synthesized in Examples 1 to 4 have high volatility, are thermally stable and convert to pure copper on decomposition, and therefore, they are suitable MOCVD precursors for copper deposition.

<Deposition of Copper Thin Film>

EXAMPLE 5

A Si(001) wafer having an oxide layer on its surface was heated to 250° C. at an initial pressure of 4 mTorr. Cu(dmamp)$_2$ prepared in Example 1 was vaporized at 40° C. and the vapor was transported to the surface of the wafer using an argon carrier gas (flow rate 5 sccm) at a total pressure of 60 mTorr to deposit a film thereon (deposition rate: 300 nm/h).

Figure 10:
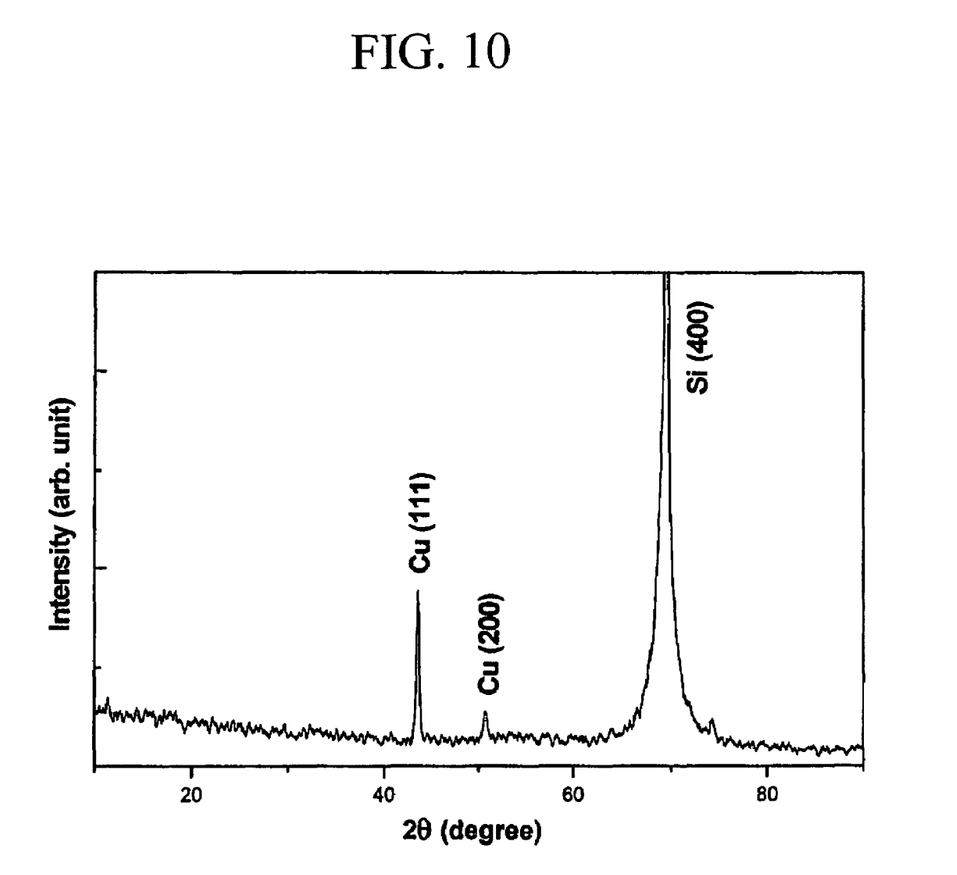
FIGS. 10 and 11: XRD patterns of the copper thin films obtained in Examples 5 and 7, respectively.

X-ray photoelectron spectrum and XRD pattern (FIG. 10) of the deposited film having a specific resistance of 50 Ω·cm showed that the deposited film was a pure crystalline copper metal film.

EXAMPLE 6

The procedure of Example 5 was repeated except that the Si(001) wafer was heated to 300° C., to deposit a film thereon (deposition rate: 85 nm/h).

X-ray photoelectron spectrum and XRD pattern of the deposited film having a specific resistance of 80 Ω·cm showed that the film was a pure crystalline copper metal film.

EXAMPLE 7

The procedure of Example 5 was repeated except that Cu(deamp)$_2$ prepared in Example 2 was employed and vaporized at 38° C., to deposit a film thereon (deposition rate: 37 nm/h).

Figure 11:
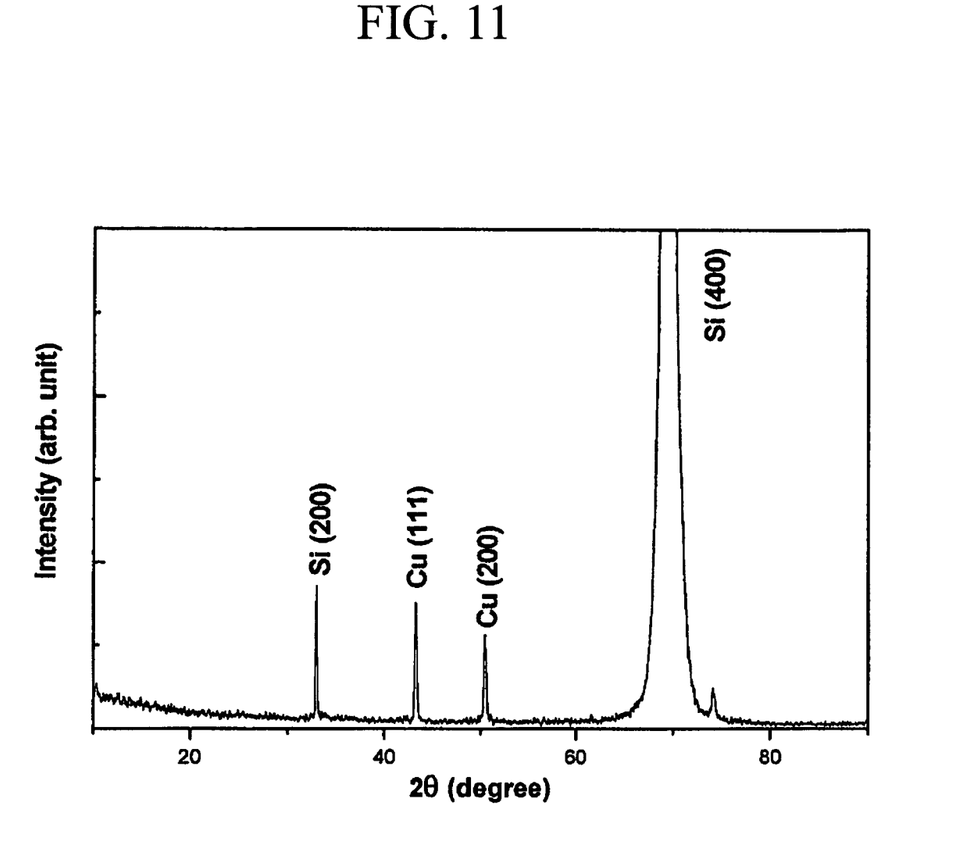

X-ray photoelectron spectrum and XRD pattern (FIG. 11) of the deposited film showed that the film was a pure crystalline copper metal film.

EXAMPLE 8

The procedure of Example 7 was repeated except that the Si(001) wafer was heated to 300° C., to deposit a film thereon (deposition rate: 20 nm/h).

X-ray photoelectron spectrum and XRD pattern of the deposited film showed that the film was a pure non-crystalline copper metal film.

EXAMPLE 9

A Si(001) wafer having a TiN thin film coating on its surface was heated to each of temperatures 190, 200, 210, 220 or 240° C. at an initial pressure of 4 mTorr. Cu(dmamb)$_2$ prepared in Example 3 was vaporized at 70° C. and the vapor was transported to the surface of the wafer without using a carrier gas at a total pressure of 80 mTorr to deposit a film thereon.

X-ray photoelectron spectrum and XRD pattern of the deposited film having a very low specific resistance of 2.3 μΩ·cm at a deposition temperature of 200° C. showed that the deposited film was a pure crystalline copper metal film.

A scanning electron microscopy (SEM) image thereof exhibited no sign of agglomeration of the deposited copper thin film.

EXAMPLE 10

The procedure of Example 9 was repeated except that a Si(001) wafer having a TaN thin film coating on its surface was heated to 220°C., to deposit a film thereon.

The characteristics of the deposited film were similar to those of the film prepared in Example 9.

As shown above, the copper complex of the present invention can be vaporized at a low temperature and is thermally stable, and therefore, it may be effectively employed in MOCVD of a copper thin film having an improved quality.

While the embodiments of the subject invention have been described and illustrated, it is obvious that various changes and modifications can be made therein without departing from the spirit of the present invention which should be limited only by the scope of the appended claims.

What is claimed is:

1. A copper aminoalkoxide complex of formula (I):

(I)

wherein, $R^1$, $R^2$, $R^3$ and $R^4$ are each independently $C_{1-4}$ alkyl optionally carrying one or more fluorine substituents; and m is an integer in the range of 1 to 3.

2. The compound of claim 1, wherein $R^1$, $R^2$, $R^3$ and $R^4$ are each independently $CH_3$, $CF_3$, $C_2H_5$, $CH(CH_3)_2$ or $C(CH_3)_3$, and m is 1 or 2.

3. A process for preparing the compound of claim 1, comprising reacting a compound of formula (II) with a compound of formula (III) in an organic solvent:

$$Cu(OMe)_2 \qquad (II)$$

$$HOCR^1R^2(CH_2)_m NR^3R^4 \qquad (III)$$

wherein, $R^1$, $R^2$, $R^3$, $R^4$ and m are the same as defined in claim 1.

4. A process for preparing the compound of claim 1, comprising reacting a compound of formula (IV) with a compound of formula (V) in an organic solvent:

$$CuX_2 \qquad (IV)$$

$$MOCR^1R^2(CH_2)_m NR^3R^4 \qquad (V)$$

wherein, $R^1$, $R^2$, $R^3$, $R^4$ and m are the same as defined in claim 1; X is halogen; and M is Li or Na.

5. A process for depositing a copper thin film on a substrate which comprises bringing the vapor of the compound of claim 1 into contact with a substrate heated to a temperature ranging from 170 to 320° C.

6. The process of claim 5, wherein the compound is vaporized at a temperature ranging from 30 to 100° C.

* * * * *